United States Patent
Sofer et al.

(10) Patent No.: US 9,709,629 B2
(45) Date of Patent: Jul. 18, 2017

(54) METHOD AND CONTROL DEVICE FOR LAUNCH-OFF-SHIFT AT-SPEED SCAN TESTING

(71) Applicants: Sergey Sofer, Rishon Lezion (IL); Asher Berkovitz, Kiryat Ono (IL); Michael Priel, Netanya (IL)

(72) Inventors: Sergey Sofer, Rishon Lezion (IL); Asher Berkovitz, Kiryat Ono (IL); Michael Priel, Netanya (IL)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/758,969

(22) PCT Filed: Jan. 8, 2013

(86) PCT No.: PCT/IB2013/050149
§ 371 (c)(1),
(2) Date: Jul. 2, 2015

(87) PCT Pub. No.: WO2014/108734
PCT Pub. Date: Jul. 17, 2014

(65) Prior Publication Data
US 2015/0338460 A1 Nov. 26, 2015

(51) Int. Cl.
*G01R 31/3177* (2006.01)
*G01R 31/317* (2006.01)
*G01R 31/3185* (2006.01)

(52) U.S. Cl.
CPC ... *G01R 31/3177* (2013.01); *G01R 31/31727* (2013.01); *G01R 31/318575* (2013.01)

(58) Field of Classification Search
CPC .... G01R 31/318552; G01R 31/318525; G01R 31/318533; G01R 31/318558;
(Continued)

(56) References Cited

U.S. PATENT DOCUMENTS 7,134,061 B2 * 11/2006 Agashe .......... G01R 31/318552
714/726
7,987,401 B2 7/2011 Pandey
(Continued)

OTHER PUBLICATIONS

Badereddine, N. et al.: "Minimizing Peak Power Consumption during Scan Testing: Test Pattern Modification with X Filling Heuristics", Design and Test of Integrated Systems in Nanoscale Technology, 2006. DTIS 2006. International Conference on, Sep. 2006, pp. 359-364.
(Continued)

*Primary Examiner* — April Y Blair
*Assistant Examiner* — Rong Tang

(57) ABSTRACT

The invention provides a method for launch-off-shift at-speed scan testing for at least two scan chains of an integrated circuit comprises iteratively shifting set values for functional elements of a first one of the scan chains clocked with a shift clock, iteratively shifting set values for functional elements of a second one of the scan chains clocked with the shift clock, launching an at-speed scan test clocked with a functional clock for the first one of the scan chains at a last shift cycle of the first one of the scan chains, delaying the last shift cycle for the second one of the scan chains for a predetermined time span, launching an at-speed scan test clocked with a functional clock for the second one of the scan chains at the last shift cycle of the second one of the scan chains, capturing the sample values of the functional elements of the first and second scan chains after the last shift cycle of the scan chains.

15 Claims, 2 Drawing Sheets

(58) Field of Classification Search
CPC .......... G01R 31/31922; G01R 31/3177; G01R 31/31727; G01R 31/318575
USPC ........................................................ 714/726
See application file for complete search history.

(56) References Cited

U.S. PATENT DOCUMENTS

| | | |
|---|---|---|
| 8,205,125 B2 | 6/2012 | Hales et al. |
| 2007/0162805 A1 | 7/2007 | Saxena et al. |
| 2008/0126898 A1 | 5/2008 | Pandey |
| 2008/0222471 A1 | 9/2008 | Sul et al. |
| 2009/0039897 A1* | 2/2009 | Fong ................. G01R 31/3167 324/537 |
| 2009/0125769 A1* | 5/2009 | Nguyen ......... G01R 31/318552 714/731 |
| 2010/0011264 A1 | 1/2010 | Pugliesi-Conti et al. |

OTHER PUBLICATIONS

Lin, X. et al.: "Scan Shift Power Reduction by Freezing Power Sensitive Scan Cells", Journal of Electronic Testing, vol. 24, No. 4, pp. 327-334.
Mentor Graphics Corporation: "Tessent TestKompress User's Guide", 2011, p. 134.
Bosio, A. et al.: "Power-Aware Test Pattern Generation for At-Speed LOS Testing", 2011 Asian Test Symposium, Nov. 2011, pp. 506-510.
International Search Report and Written Opinion correlating to PCT/IB2013/050149 issued on Sep. 26, 2013.
Noam Benayahu et al., Launch-off-shift at-speed test, Test & measurement 1-3,6-8 World, Jun. 1, 2007, ISSN 0744-1657.

* cited by examiner

METHOD AND CONTROL DEVICE FOR LAUNCH-OFF-SHIFT AT-SPEED SCAN TESTING

FIELD OF THE INVENTION

This invention relates to a method for launch-off-shift at-speed scan testing. The invention also relates to a control device configured to control launch-off-shift at-speed scan testing of an integrated circuit.

BACKGROUND OF THE INVENTION

At-speed scan testing is an efficient test method for testing the internal functionality of integrated circuits, so called circuits under tests (CUT). For example, the maximum operation frequency of the CUT or at least parts of the CUT may be determined by pre-loading functional blocks of a scan chain with predefined set values and placing the scan chain into a functional mode thereby launching the function of the functional blocks. In a capture phase following the launch the output values of the functional blocks may be captured sequentially and analysed for coherence with an expected test outcome depending on the input set value pattern.

The essence of such at-speed scan testing lies in initializing the functional elements of a scan chain such as flip-flops with predefined values of a test pattern, usually by "shifting" the data items into the flip-flops via external access ports or scan-in pins using a test shift clock which may be slower than the usual functional clock of the CUT. Upon shifting the critical paths under test are launched and the states of the flip-flops are sampling in a capture operation. The capture operation may be applied in the faster functional clock regime, resulting in a so called AC scan. If the CUT is fully operational the transition will timely propagate to the end of the scan chain resulting in the correct, i.e. expected capture value pattern. In case of unwanted delays causing a slow propagation, the transition from launch to capture will result in an erroneous, i.e. unexpected capture value pattern so that defects in the CUT may be detected.

FIG. 1 exemplarily shows the sequence of shift cycles S, launch cycle L and capture cycle C for a single scan chain of a CUT in the upper diagram DC for the text clock signal CLK. During the shift cycles S a slow clock frequency is applied, while during the launch cycle L and the capture cycle C the full functional fast clock frequency is applied. The diagram DP below exemplarily indicates the typical distribution of power consumption P in the CUT which is induced by the increased switching activity during the shift cycles S. Any of the flip-flops of the scan chain may potentially toggle, and the transitions due to the toggling flip-flops propagate into the scan chain under test, potentially triggering additional transitions there. As a result—and as shown schematically in the power distribution diagram D2—at-speed scan tests may suffer from high peak power during certain critical phases in the scanning procedure stemming from large supply currents that causes large voltage drops over the CUT.

The type of at-speed scan test depicted in FIG. 1 is a so called "Launch-off-shift" (LOS) scan test which provides a better coverage of the CUT while at the same time involves shorter testing durations.

Several approaches have been pursued in the prior art to combat the high power peaks during at-speed scan testing which may create supply voltage noise potentially altering the operating frequency of the CUT thereby causing timing problems such as hold-time violations. Especially hold-time variations may severely impact the testing function and lead to incorrect conclusions drawn from evaluating the captured test patterns.

Bosio, A. et al.: "Power-Aware Test Pattern Generation for At-Speed LOS Testing", 2011 Asian Test Symposium, November 2011, pages 506-510, disclose a smart X-filling framework for launch-off-capture (LOC) at-speed scan tests which are able to adapt peak power consumption during the launch-to-capture cycle according to the functional power, i.e. the power consumption of the circuit in functional mode.

Mentor Graphics Corporation: "Tessent TestKompress User's Guide", 2011, page 134, discloses a method to control shift power by changing the shift data through a combination of hardware and software for the shift cycles in at-speed scan tests.

Lin, X. et al.: "Scan Shift Power Reduction by Freezing Power Sensitive Scan Cells", Journal of Electronic Testing, Volume 24, Number 4, pages 327-334 disclose a signal probability based approach for launch-off-capture at-speed scan tests to identify a set of power sensitive scan cells the output of which is frozen using additional hardware during scan shifting in order to reduce the shift power consumption.

The document U.S. Pat. No. 8,205,125 B2 discloses a test controller for at-speed scan testing an integrated circuit which implements an enhanced method for launch-off-shift testing with reduced delay and optimized synchronicity for different scan chains.

The document U.S. Pat. No. 7,987,401 B2 discloses a method for generating self-synchronized launch-off-shift capture pulses using on-chip phase locked loops for at-speed scan testing in order to achieve better coverage of multiple frequency operated clock domains.

Badereddine, N. et al.: "Minimizing Peak Power Consumption during Scan Testing: Test Pattern Modification with X Filling Heuristics", Design and Test of Integrated Systems in Nanoscale Technology, 2006, DTIS 2006, International Conference on, September 2006, pages 359-364, disclose reducing high current levels during an at-speed scan test cycle based on power-aware assignment of "don't care" bits in deterministic test patterns.

The document U.S. 2008/0222741 A1 discloses a chip including circuitry to provide differently skewed test clock signals to the registers of different scan chain segments, respectively, in order to spread the power consumption of the different scan chain segments during the scan input periods of an at-speed scan test.

The document U.S. 2007/0162805 A1 discloses cycling the shift phases of different scan chain domains of an integrated circuit under scan-at-speed testing in an altering fashion, so that the power consumption of the integrated circuit during the shift phases is spread out.

There is a need for solutions which reduce the power consumption in the LOS cycle of an LOS at-speed scan testing architecture of a CUT.

SUMMARY OF THE INVENTION

The present invention provides a method for launch-off-shift at-speed scan testing, a control device configured to control launch-off-shift at-speed scan testing of an integrated circuit and an integrated circuit comprising such a control device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

One idea of the present invention is to provide for a procedure which allows pipelining the LOS cycles for different scan chains of a CUT one by one thereby providing a digital dithering circuit which spreads the power consumption during the LOS cycles over a larger period of time. This aids in avoiding large power peaks by allowing a slow build-up of power consumption during the launch phase. The procedure involves delaying each of the LOS cycles with respect to the remaining LOS cycles by at least one clock cycle of the functional clock of the CUT, thereby creating a staggered LOS cycle pattern for the different scan chains.

Figure 2:
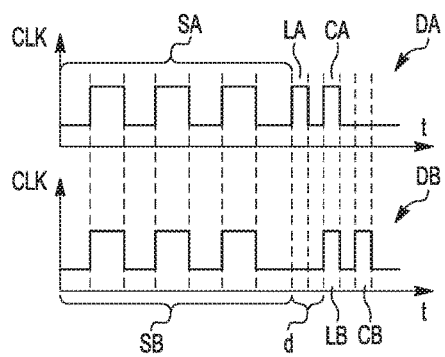
FIG. 2 schematically shows another example of a clock diagram and power consumption diagram over the course of an LOS at-speed scan test of an integrated circuit according to an embodiment of the invention.

FIG. 2 schematically shows examples of clock diagrams DA and DB over the course of an LOS at-speed scan test of an integrated circuit having two scan chains. The upper diagram DA is representative for the testing sequence of a first one of the scan chains, while the lower diagram DB is representative for the testing sequence of a second one of the scan chains. Of course, it may be possible to provide more than two scan chains, and the respective testing sequences may be implemented similar to the diagrams DA and DB.

Figure 1:
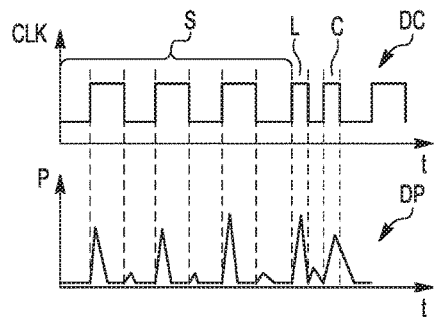
FIG. 1 schematically shows an exemplary clock diagram and an example of a power consumption diagram over the course of an LOS at-speed scan test of an integrated circuit.

The shifting cycles SA and SB may be implemented similarly to the shifting cycles S as detailed in conjunction with diagram D in FIG. 1 above. In particular, it may be possible that the shifting clock cycles for each of the scan chains may coincide. It may also be possible to shift the setting values of the functional elements of the two scan chains in turns, so that only one shifting action in either one of the scan chains is performed at a time. Finally, it may be possible to delay the sequences of shifting cycles SA and SB with respect to one another by a fraction of the shift clock. The shift clock for the shifting cycles SA and SB may in particular be a slow shift clock, i.e. having a clock frequency smaller than the frequency of the normal or usual functional clock for the scan chains or the CUT.

After having iteratively shifted the set values for functional elements of the scan chains with the shift clock, an at-speed scan test may be launched on the last shift cycle of the respective scan chains (a so called "launch-off-shift" LOS at-speed scan test). The at-speed scan test may preferably be clocked with a functional clock for each one of the scan chains, the frequency of which may be a usual functional frequency of the scan chains or the integrated circuit. For the first one of the scan chains, the last shift cycle LA may follow directly after the shifting cycles SA, as exemplarily shown in diagram DA. It may also be possible to introduce a small guardband period after the shifting cycles SA. The last shift cycle LB of the second one of the scan chains, however, may be delayed with respect to the last shift cycle LA of the first one of the scan chains for a predetermined time span d. In diagram DB, this predetermined time span d comprises one clock cycle of the functional clock. It may of course also be possible to implement a predetermined time span d being larger than one clock cycle of the functional clock. It may also be possible to implement a predetermined time span d being a fraction of one clock cycle of the functional clock.

The predetermined time span d may allow for a spreading of the last shift cycles LA and LB over a larger time frame, i.e. the last shift cycles LA and LB do not coincide. This has the advantage that the energy required to perform the launching operation of the at-speed scan test is spread over the larger time frame, resulting in an overall lower peak power consumption within the integrated circuit. As a consequence, the voltage drop over the integrated circuit as a whole is lowered especially during the launching phase of the at-speed scan test. This means that the beneficial decrease of testing duration associated with LOS at-speed scan tests may be maintained, while at the same time combating the negative impacts of increase peak power consumption during the launching shift cycle, such as increased probability of testing failures, detection of wrong test results, adverse effects on the testing voltage supply components of the integrated circuit or increased path delay of the CUT.

In capture clock cycles CA and CB following the respect last shift cycles LA and LB the sample values of the functional elements of the scan chains may be captured. The capture clock cycles CA and CB are spread over a larger time frame at least by virtue of the last shift cycles LA and LB having been spread. This advantageously reduces the error probability during the capturing phases of the at-speed scan test.

Figure 3:
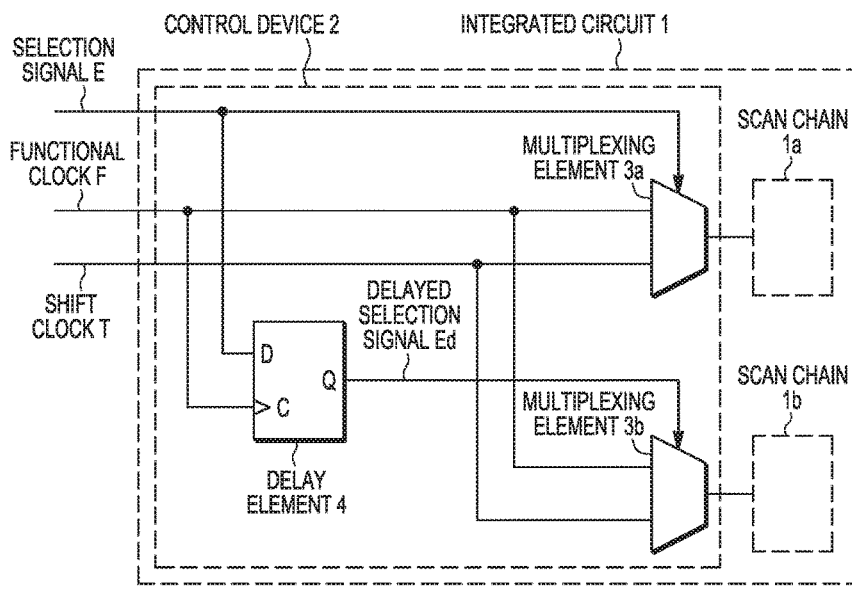
FIG. 3 schematically illustrates a control device for LOS at-speed scan testing of an integrated circuit according to a further embodiment of the invention.

FIG. 3 schematically illustrates a control device 2 for LOS at-speed scan testing of an integrated circuit 1. The integrated circuit 1 or circuit under test (CUT) may comprise at least two scan chains 1a, 1b. The scan chains 1a, 1b may be logic clouds of functional circuitry blocks or scan cells such as flip-flops. Of course, similar functional elements may be used in the scan chains 1a, 1b as well.

The control device may comprise a first input configured to receive a shift clock T for iteratively shifting set values for functional elements of the two scan chains 1a, 1b clocked with the shift clock T. To that end, the shift clock T may be delivered to a first input of a first multiplexing element 3a the output of which may be coupled to the first one of the scan chains 1a. A second input of the control device 2 may be configured to a functional clock F of the integrated circuit 1. The functional clock F may be input to a second input of the first multiplexing element 3a. The first multiplexing element 3a may in a shifting cycle phase for the first one of the scan chains 1a deliver the shift clock T to the scan chain 1a. Upon the last shift cycle LA the first multiplexing element 3a may be switched from the output of the shift clock T to the output of the functional clock F. This switch may be initiated upon receipt of a selection signal E which may be input to the control device 2 via a third input of the control device 2.

The shift clock T may also be delivered to a first input of a second multiplexing element 3b the output of which may be coupled to the second one of the scan chains 1b. Similarly, the functional clock F may be input to a second input of the second multiplexing element 3b, so that the clock delivered to the second one of the scan chains 1b may be switched from the shift clock T to the functional clock F at the last shift cycle LB. However, the selection signal Ed responsible for switching the second multiplexing element 3b may be delayed with respect to the selection signal E. This may be effected by a first delay element 4 which may be configured to delay the selection signal E for a predetermined time span d to generate a delayed selection signal Ed. The first delay element 4 may for example comprise a digital delay element, such as a D-flip-flop or a similar zero-order hold device. It may also be possible to provide an analogue delay element as the first delay element 4, such as a bucket brigade device or a similar analogue delay line.

The first delay element 4 may be clocked with the functional clock F input at a clock input so as to delay the selection signal E input at a data input for outputting the delayed selection signal Ed at the output. In that case, the delayed selection signal Ed may be delayed with respect to the selection signal E by one clock cycle of the functional clock F. It may for example also be possible to introduce further delay elements connected in series to the first delay element 4 in order to provide for an increased and flexibly adjustable delay d.

Figure 4:
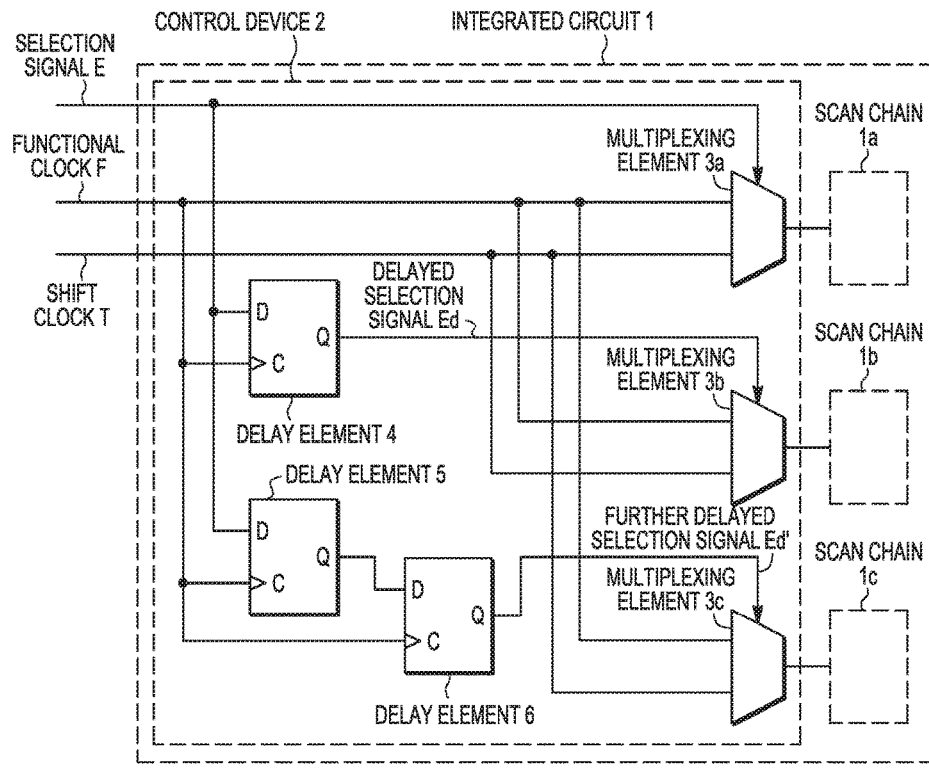
FIG. 4 schematically illustrates a further control device for LOS at-speed scan testing of an integrated circuit according to yet another embodiment of the invention.

FIG. 4 schematically illustrates a further control device 2 for LOS at-speed scan testing of an integrated circuit 1. The integrated circuit 1 of FIG. 4 comprises a third scan chain 1c which is operably coupled to a third multiplexing element 3c. The third multiplexing element 3c may be configured to switch the clock delivered to the third scan chain 1c from the shift clock T to the functional clock F upon receipt of a further delayed selection signal Ed', which may be generated by a second delay element 5 and a third delay element 6 operably coupled in series. The second delay element 5 may be configured similarly to the first delay element 4 for the second one of the scan chains 1b. The output of the second delay element 5 may input to a data input of third delay element 6. The third delay element 6 may be configured generate the further delayed selection signal Ed' clocked with the functional clock F. With the control device 2 of FIG. 4 it will be possible to generate a series of temporally staggered selection signals which in turn spread the last shift cycles of the different scan chains 1a, 1b and 1c over a time window without the last shift cycles overlapping. Of course, it may similarly be possible to implement further delay lines for further scan chains in excess of three within the control device 2.

Figure 5:
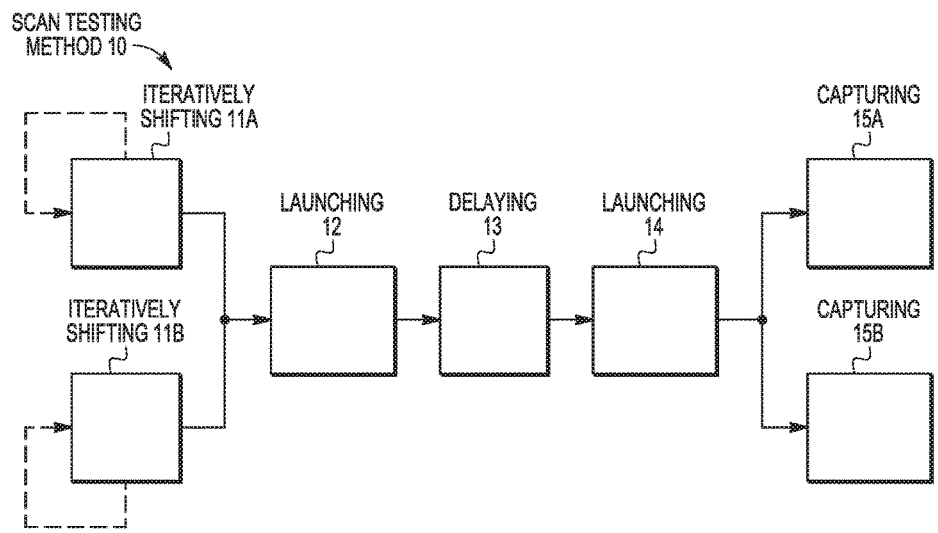
FIG. 5 schematically shows an example of an embodiment of a method for launch-off-shift at-speed scan testing.

FIG. 5 schematically illustrates a method 10 for launch-off-shift at-speed scan testing of an integrated circuit, such as the integrated circuit 1 as explained in conjunction with FIGS. 3 and 4. The method 10 may advantageously be implemented by using a control device such as the control device 2 in FIGS. 3 and 4. The method 10 may comprise as first steps 11a and 11b iteratively shifting set values for functional elements of a first one and a second one of the scan chains clocked with a shift clock (T). After that, an at-speed scan test clocked with a functional clock F may be launched for the first one of the scan chains 1a at a last shift cycle LA of the first one of the scan chains 1a in a second step 12. In a third step 13, the last shift cycle LB for the second one of the scan chains 1b may be delayed for a predetermined time span d, so that in a fourth step 14 an at-speed scan test clocked with the functional clock F for the second one of the scan chains 1b may be launched at the last shift cycle LB of the second one of the scan chains 1b.

In fifth steps 15a and 15b, the sample values of the functional elements of the first one and second of the scan chains may be captured after the respective last shift cycles LA and LB. The predetermined time span d may for example have a duration substantially equal to the duration of at least one clock cycle of the functional clock F. The method 10 is particularly useful, if the frequency of the functional clock F is larger than the frequency of the shift clock T.

The method 10 may for example be implemented in a computer readable program product, which contains instructions which, when executed on a computer, cause the computer to perform the method 10. The instructions may be part of a computer program, i.e. a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be e.g. stored internally on computer readable storage medium or transmitted to the computer system via a computer readable transmission medium. All or some of the computer program may be provided on tangible and non transitory computer readable media permanently, removably or remotely coupled to an information processing system. The tangible and non transitory computer readable media may include, for example and without limitation, any number of the following: magnetic storage media including disk and tape storage media; optical storage media such as compact disk media (e.g., CD ROM, CD R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

Because the apparatus implementing the present invention is, for the most part, composed of electronic components and circuits known to those skilled in the art, details of the circuitry and its components will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different circuitry components. For example, the example of a topology in the figures and the discussion thereof is presented merely to provide a useful reference in discussing various aspects of the invention. Of course, the description of the topology has been simplified for purposes of discussion, and it is just one of many different types of appropriate topologies that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely examples, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Devices functionally forming separate devices may be integrated in a single physical device.

In the claims, any reference signs placed between parentheses shall not be construed as limiting the claim. The word "comprising" does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage. The order of method steps as presented in a claim does not prejudice the order in which the steps may actually be carried, unless specifically recited in the claim.

The invention claimed is:

1. A method for launch-off-shift at-speed scan testing for at least two scan chains of an integrated circuit, comprising:
   iteratively shifting set values for functional elements of a first one of the scan chains clocked with a shift clock;
   iteratively shifting set values for functional elements of a second one of the scan chains clocked with the shift clock;
   launching an at-speed scan test clocked with a functional clock for the first one of the scan chains at a first last shift cycle of the first one of the scan chains;
   delaying a second last shift cycle of the second one of the scan chains relative to the first last shift cycle of the first one of the scan chains for a predetermined time span based on a clock cycle of the functional clock;
   launching an at-speed scan test clocked with the functional clock for the second one of the scan chains at the second last shift cycle of the second one of the scan chains;
   capturing the sample values of the functional elements of the first one of the scan chains after the first last shift cycle of the first one of the scan chains; and
   capturing the sample values of the functional elements of the second one of the scan chains after the second last shift cycle of the second one of the scan chains.

2. The method of claim 1, wherein the predetermined time span has a duration equal to the duration of at least one clock cycle of the functional clock within a margin of a half clock cycle of the functional clock.

3. The method of claim 1, wherein the frequency of the functional clock is larger than the frequency of the shift clock.

4. The method of claim 1, wherein the delaying the second last shift cycle for the second one of the scan chains is performed by digitally delaying a selection signal for selecting between the shift clock and the functional clock to be applied to the second one of the scan chains.

5. The method of claim 1, wherein the delaying the second last shift cycle for the second one of the scan chains is performed by analogue delaying a selection signal for selecting between the shift clock and the functional clock to be applied to the second one of the scan chains.

6. A control device for launch-off-shift at-speed scan testing for at least two scan chains of an integrated circuit, the control device comprising:
   a shift clock input configured to receive a shift clock for iteratively shifting set values for functional elements of the at least two scan chains clocked with the shift clock;
   a functional clock input configured to receive a functional clock;
   a first multiplexor coupled to the first one of the scan chains and configured to switch the clock delivered to the first one of the scan chains from the shift clock to the functional clock upon receipt of a selection signal;
   a first delay to delay the selection signal for a predetermined time span based on a clock cycle of the functional clock to generate a delayed selection signal relative to the selection signal; and
   a second multiplexor coupled to the second one of the scan chains and configured to switch the clock delivered to the second one of the scan chains from the shift clock to the functional clock upon receipt of the delayed selection signal.

7. The control device of claim 6, further configured to capture the sample values of the functional elements of the scan chains after switching the clock delivered to the respective scan chains from the shift clock to the functional clock.

8. The control device of claim 6, further comprising:
   a third multiplexor coupled to a third one of the scan chains and configured to switch the clock delivered to the third one of the scan chains from the shift clock to the functional clock upon receipt of a further delayed selection signal;

a second delay and a third delay coupled in series, the second and third delays configured to delay the selection signal to generate the further delayed selection signal, the further delayed selection signal being delayed for longer than the delayed selection signal.

9. The control device of claim 6, wherein the predetermined time span has a duration equal to the duration of at least one clock cycle of the functional clock within a margin of a half clock cycle of the functional clock.

10. The control device of claim 6, wherein the frequency of the functional clock is larger than the frequency of the shift clock.

11. An integrated circuit, comprising:

a control device for launch-off-shift at-speed scan testing for at least two scan chains of the integrated circuit, the control device including:

a shift clock input configured to receive a shift clock for iteratively shifting set values for functional elements of the at least two scan chains clocked with the shift clock;

a functional clock input configured to receive a functional clock, a first multiplexor coupled to the first one of the scan chains and configured to switch the clock delivered to the first one of the scan chains from the shift clock to the functional clock upon receipt of a selection signal, a first delay to delay the selection signal for a predetermined time span based on a clock cycle of the functional clock to generate a delayed selection signal relative to the selection signal, and a second multiplexor coupled to the second one of the scan chains and configured to switch the clock delivered to the second one of the scan chains from the shift clock to the functional clock upon receipt of the delayed selection signal; and at least two scan chains each including a plurality of functional elements operably coupled to the control device.

12. The integrated circuit of claim 9, further configured to capture the sample values of the functional elements of the scan chains after switching the clock delivered to the respective scan chains from the shift clock to the functional clock.

13. The integrated circuit of claim 9, further comprising:

a third multiplexor coupled to a third one of the scan chains and configured to switch the clock delivered to the third one of the scan chains from the shift clock to the functional clock upon receipt of a further delayed selection signal;

a second delay and a third delay coupled in series, the second and third delays configured to delay the selection signal to generate the further delayed selection signal, the further delayed selection signal being delayed for longer than the delayed selection signal.

14. The integrated circuit of claim 9, wherein the predetermined time span has a duration equal to the duration of at least one clock cycle of the functional clock within a margin of a half clock cycle of the functional clock.

15. The integrated circuit of claim 9, wherein the frequency of the functional clock is larger than the frequency of the shift clock.

* * * * *